United States Patent
Ha et al.

(10) Patent No.: US 10,256,644 B2
(45) Date of Patent: Apr. 9, 2019

(54) METHOD AND APPARATUS FOR SUPPLYING POWER

(71) Applicant: Samsung Electronics Co., Ltd., Suwon-si, Gyeonggi-do (KR)

(72) Inventors: Taesin Ha, Seongnam-si (KR); Youngbo Shim, Seoul (KR); Hyun Do Choi, Yongin-si (KR); Kyung-Rock Kim, Yongin-si (KR); Jeonghun Kim, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 183 days.

(21) Appl. No.: 15/468,277

(22) Filed: Mar. 24, 2017

(65) Prior Publication Data

US 2018/0115172 A1 Apr. 26, 2018

(30) Foreign Application Priority Data

Oct. 26, 2016 (KR) .................. 10-2016-0140267

(51) Int. Cl.
*H02J 7/00* (2006.01)
*H01L 43/04* (2006.01)

(52) U.S. Cl.
CPC ............ *H02J 7/0026* (2013.01); *H01L 43/04* (2013.01); *H02J 7/0045* (2013.01)

(58) Field of Classification Search
CPC ........ H02J 7/0026; H02J 7/0045; H01L 43/04
USPC ........................................................ 307/31
See application file for complete search history.

(56) References Cited

U.S. PATENT DOCUMENTS

| 2007/0279852 A1* | 12/2007 | Daniel ................. A44C 5/0007 361/679.03 |
| 2013/0197408 A1 | 8/2013 | Goldfarb et al. |
| 2014/0200491 A1 | 7/2014 | Julin et al. |

FOREIGN PATENT DOCUMENTS

| CN | 10-4767277 A | 7/2015 |
| JP | 2013/158443 A | 8/2013 |
| JP | 2014/236844 A | 12/2014 |
| KR | 10-0821641 B1 | 4/2008 |

* cited by examiner

*Primary Examiner* — Carlos D Amaya
(74) *Attorney, Agent, or Firm* — Harness, Dickey & Pierce, P.L.C.

(57) ABSTRACT

A method and apparatus for supplying a power to a hardware module when the hardware module is mounted are provided. The method and apparatus may supply a power to a hardware module when both a mounting signal indicating that the hardware module is mounted in a module circuit and a trigger signal input by a user are received.

16 Claims, 17 Drawing Sheets

METHOD AND APPARATUS FOR SUPPLYING POWER

CROSS-REFERENCE TO RELATED APPLICATION

This application claims under 35 U.S.C. § 119 to Korean Patent Application No. 10-2016-0140267, filed on Oct. 26, 2016, in the Korean Intellectual Property Office, the entire contents of which are incorporated herein by reference in its entirety.

BACKGROUND

1. Field

At least one example embodiment relates to a method and/or apparatus for supplying a power. For example, at least one example embodiment relates to a method and/or apparatus for supplying a power to a detachable hardware module.

2. Description of the Related Art

With the onset of rapidly aging societies, many people may experience inconvenience and/or pain from joint problems. Thus, there may be growing interest in walking assistance devices that may enable the elderly and/or patients having joint problems to walk with less effort.

SUMMARY

Some example embodiments relate to a method of supplying a power to at least one hardware device.

In some example embodiments, the method may include generating a mounting signal, if the at least one hardware device is mounted in a module circuit; generating a trigger signal in response to a power-on signal input by a user; and connecting a battery to each of the at least one hardware device when both the mounting signal and the trigger signal are detected.

In some example embodiments, the generating the mounting signal comprises: outputting an enable signal as the mounting signal, if the voltage of the module circuit is greater than or equal to a set voltage; and outputting a disable signal as the mounting signal, if the voltage of the module circuit is less than the set voltage.

In some example embodiments, the generating the mounting signal comprises: generating the mounting signal, if the voltage of the module circuit is greater than or equal to a first set voltage and the voltage of the module circuit is less than a second set voltage.

In some example embodiments, the module circuit comprises: one or more switches each corresponding to one of the at least one hardware device, the one or more switches each being configured to short the module circuit, if a corresponding one of the at least one hardware device is mounted in the module circuit.

In some example embodiments, the module circuit comprises: one or more hall sensors each corresponding to one of the at least one hardware device, the one or more the hall sensors being configured to short the module circuit, if a corresponding one of the at least one hardware device is mounted in the module circuit.

In some example embodiments, the generating the mounting signal comprises: determining whether a measurement value of the one or more hall sensors is greater than or equal to a set threshold, the measurement value being generated by a magnet included in the at least one hardware device; and shorting, by the one or more hall sensors, the module circuit when the measurement value is greater than or equal to the threshold.

In some example embodiments, the connecting the battery to each of the at least one hardware device comprises: generating an operation signal when both the mounting signal and the trigger signal are detected; amplifying the operation signal; and connecting, via a relay circuit, the battery to each of the at least one hardware device based on the amplified operation signal.

Some example embodiments relate to an apparatus configured to supply a power to at least one hardware device.

In some example embodiments, the apparatus includes a module circuit including at least one connector each corresponding to a respective one of the at least one hardware device; a comparison circuit configured to output a mounting signal, if a voltage of the module circuit is greater than or equal to a set voltage; a trigger circuit configured to detect a trigger signal in response to a power-on signal input by a user; an operation signal generation circuit configured to generate an operation signal based on the mounting signal and the trigger signal; and a power control circuit configured to connect a battery to each of the at least one hardware device based on the operation signal.

In some example embodiments, the apparatus is configured to short a circuit of each of the at least one connector, if the at least one hardware device is mounted in the at least one connector.

In some example embodiments, the comparison circuit is further configured to, compare the voltage of the module circuit to the set voltage; output an enable signal as the mounting signal, if the voltage of the module circuit is greater than or equal to the set voltage; and output a disable signal as the mounting signal, if the voltage of the module circuit is less than the set voltage.

In some example embodiments, the comparison circuit comprises: a first comparator configured to output a first mounting signal, if the voltage of the module circuit is greater than or equal to a first set voltage; a second comparator configured to output a second mounting signal, if the voltage of the module circuit is less than a second set voltage; and an AND element configured to output the mounting signal based on the first mounting signal and the second mounting signal.

In some example embodiments, each of the at least one connector comprises: a switch configured to short a circuit of a connector, if a hardware device corresponding to the switch is mounted in the connector.

In some example embodiments, each of the at least one connector comprises: a hall sensor configured to short a circuit of a connector, if a hardware device corresponding to the hall sensor is mounted in the connector.

In some example embodiments, the hall sensor is further configured to, determine whether a measurement value of the hall sensor generated by a magnet included in the hardware device corresponding to the hall sensor is greater than or equal to a set threshold, and short the circuit of the connector, if the measurement value is greater or equal to the set threshold.

In some example embodiments, the power control circuit comprises: an amplifier configured to amplify the operation signal; and a relay circuit configured to connect the battery to each of the at least one hardware device based on the amplified operation signal.

In some example embodiments, the apparatus is included in a walking assistance apparatus, the walking assistance apparatus including the at least one hardware device.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1:
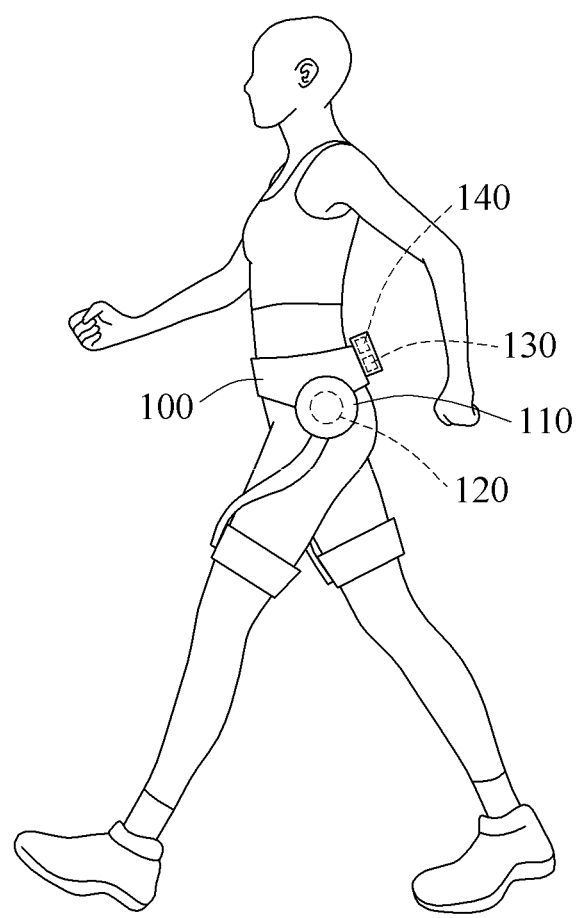
FIGS. 1 and 2 illustrate a walking assistance apparatus according to at least one example embodiment.

Hereinafter, some example embodiments will be described in detail with reference to the accompanying drawings. The scope of the present disclosure, however, should not be construed as limited to the embodiments set forth herein. Like reference numerals in the drawings refer to like elements throughout the present disclosure.

Various modifications may be made to the example embodiments. However, it should be understood that these embodiments are not construed as limited to the illustrated forms and include all changes, equivalents or alternatives within the idea and the technical scope of this disclosure.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "include" and/or "have," when used in this specification, specify the presence of stated features, integers, steps, operations, elements, components or combinations thereof, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which these example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Regarding the reference numerals assigned to the elements in the drawings, it should be noted that the same elements will be designated by the same reference numerals, wherever possible, even though they are shown in different drawings. Also, in the description of embodiments, detailed description of well-known related structures or functions will be omitted when it is deemed that such description will cause ambiguous interpretation of the present disclosure.

<Summary of Walking Assistance Apparatus>

Figure 2:
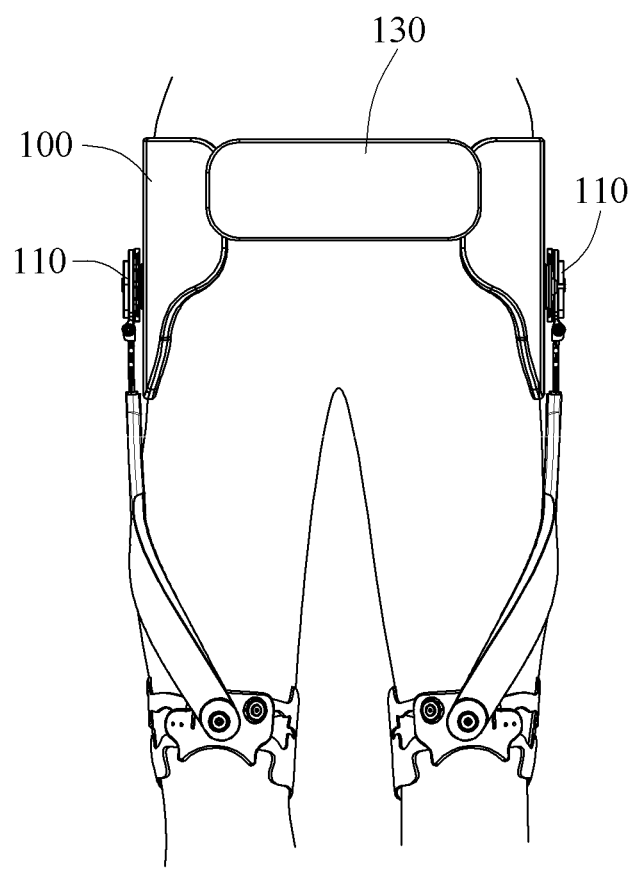

FIGS. 1 and 2 illustrate a walking assistance apparatus according to at least one example embodiment.

Referring to FIG. 1, a walking assistance apparatus 100 that may be worn on a user to assist walking of the user. The walking assistance apparatus 100 may be, for example, a wearable device.

FIG. 1 illustrates an example of a hip-type walking assistance apparatus, however, a type of walking assistance apparatuses is not limited to the hip-type walking assistance apparatus. Accordingly, the walking assistance apparatus 100 may be a walking assistance apparatus for supporting an entire pelvic limb or a walking assistance apparatus for supporting a portion of a pelvic limb. The walking assistance apparatus 100 may be, for example, one of a walking assistance apparatus for supporting a portion of a pelvic limb, a walking assistance apparatus for supporting up to a knee, and a walking assistance apparatus for supporting up to an ankle, or a walking assistance apparatus for supporting a whole body.

Example embodiments described with reference to FIG. 1 may be applicable to a hip-type walking assistance apparatus, however, there is no limitation thereto. Accordingly, example embodiments may be applicable to apparatuses for assisting walking of a user.

The walking assistance apparatus 100 may include a driving portion 110, a sensor 120, an inertial measurement unit (IMU) sensor 130 and a controller 140.

The driving portion 110 may drive hip joints of a user. The driving portion 110 may be located on, for example, a right hip portion and/or a left hip portion of the user.

The driving portion 110 may include a motor to generate a rotational torque.

The sensor 120 may measure hip joint angles of the hip joints of the user while the user is ambulatory. Information about the hip joint angles sensed by the sensor 120 may include, for example, an angle of a right hip joint, an angle of a left hip joint, a difference between both the hip joint angles, or a direction of motion for a hip joint. The sensor 120 may be located in, for example, the driving portion 110.

The sensor 120 may include a potentiometer. The potentiometer may sense a right (R)-axis joint angle, a left (L)-axis joint angle, an R-axis joint angular velocity and an L-axis joint angular velocity, based on a gait motion of the user.

The IMU sensor 130 may measure acceleration information and posture information while the user is ambulatory. For example, the IMU sensor 130 may sense an x-axis acceleration, a y-axis acceleration, a z-axis acceleration, an x-axis angular velocity, a y-axis angular velocity and a z-axis angular velocity, based on the gait motion of the user.

The walking assistance apparatus 100 may detect a point at which a foot of the user lands based on the acceleration information measured by the IMU sensor 130.

A pressure sensor (not shown) may be attached to a sole of the user, and may detect a point in time at which a foot of the user lands.

The walking assistance apparatus 100 may include, in addition to the above-described sensor 120 and IMU sensor 130, another sensor (for example, an electromyography (EMG) sensor) configured to sense a change in a bio signal and/or a quantity of motion of a user based on a gait motion.

The controller 140 may control the driving portion 110 to output an assistance force to assist walking of the user. Because the walking assistance apparatus 100 is a hip-type walking assistance apparatus, two driving portions 110 may be provided for a left hip portion and a right hip portion, and the controller 140 may output a control signal to control the driving portions 110 to generate torques.

The driving portion 110 may generate torques based on the control signal output from the controller 140.

The walking assistance apparatus 100 may include a driving portion 110 for a right leg and a driving portion 110 for a left leg. In some example embodiments, the controller 140 may be designed to control one of the driving portions 110 such that the walking assistance apparatus 100 includes a plurality of controllers 140 each configured to control a respective one of the driving portions 110. In another example embodiment, the controller 140 may be designed to control both the driving portions 110.

For example, components of the walking assistance apparatus 100 may be separated. In this example, it is possible to easily replace and upgrade the components. Separable or detachable components may be referred to as "hardware modules." For example, the driving portion 110 may be separated from a main frame of the walking assistance apparatus 100.

A hardware module may include an internal circuit, and a connection component that is configured to connect the hardware module to a main apparatus or the main frame of the walking assistance apparatus 100. The main frame may include a connector for a connection to the hardware module. The connector of the main frame may be connected to the connection component of the hardware module. When the main frame and the hardware module are connected, the main frame may supply a power to the hardware module. When a power is supplied to the hardware module even though the main frame and the hardware module are incorrectly connected, the walking assistance apparatus 100 may be damaged. Hereinafter, a method of supplying a power to a hardware module will be further described with reference to FIGS. 3 through 17.

Figure 3:
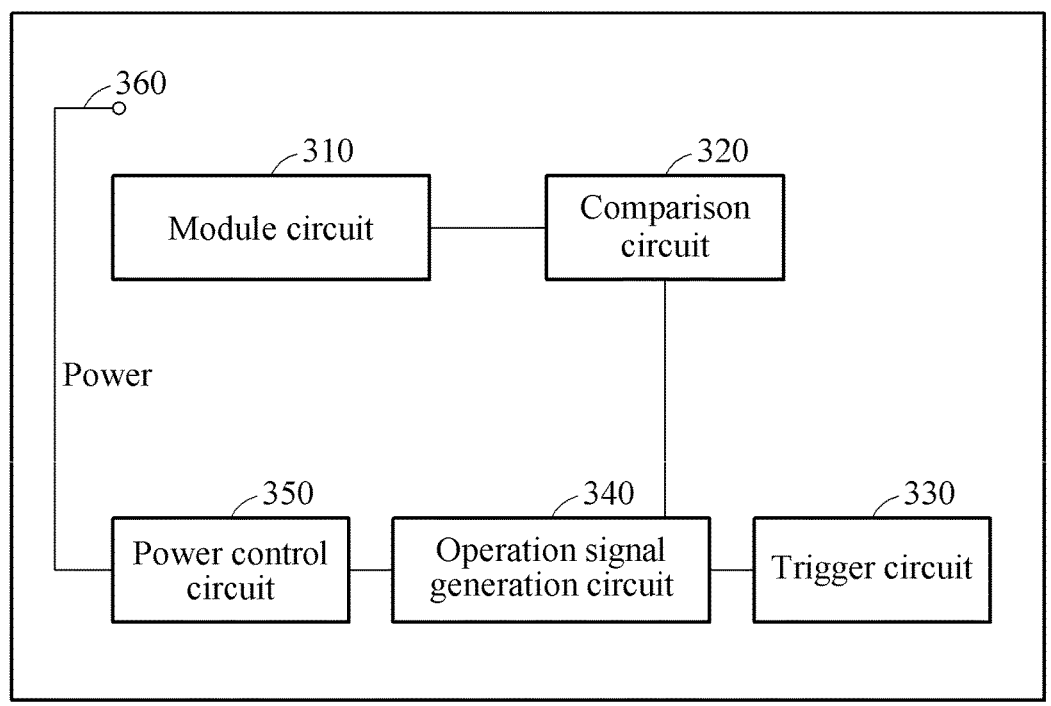
FIG. 3 illustrates an example of a configuration of a power supply apparatus according to at least one example embodiment.

FIG. 3 illustrates a configuration of a power supply apparatus 300 according to at least one example embodiment.

Referring to FIG. 3, the power supply apparatus 300 may supply a power to a hardware module connected to the power supply apparatus 300, using a power source, for example, a battery. For example, the power supply apparatus 300 may supply a power to the walking assistance apparatus 100 of FIGS. 1 and 2 and a hardware module of the walking assistance apparatus 100. The controller 140 may include the power supply apparatus 300. The power supply apparatus 300 may be configured to supply a power to the walking assistance apparatus 100 as described above, however, an operation of the power supply apparatus 300 is not limited thereto.

The power supply apparatus 300 may include a module circuit 310, a comparison circuit 320, a trigger circuit 330, an operation signal generation circuit 340, a power control circuit 350 and a power supply circuit 360. Hereinafter, examples of the module circuit 310, the comparison circuit 320, the trigger circuit 330, the operation signal generation circuit 340, the power control circuit 350 and the power supply circuit 360 will be further described with reference to FIGS. 4 through 17.

Figure 4:
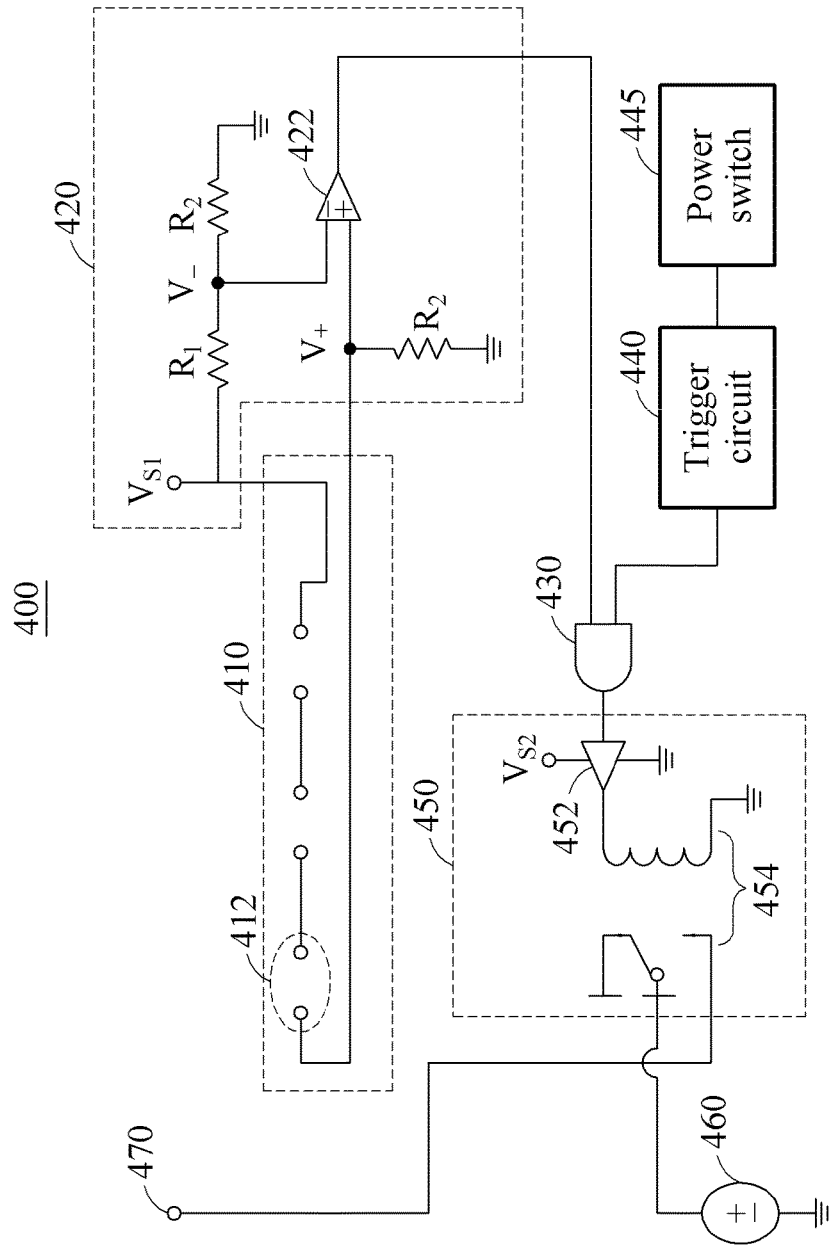
FIG. 4 illustrates a circuit of a power supply apparatus according to at least one example embodiment.

FIG. 4 illustrates a circuit of a power supply apparatus 400 according to at least one example embodiment.

The power supply apparatus 400 may correspond to the power supply apparatus 300 of FIG. 3. For example, a module circuit 410 may correspond to the module circuit 310.

The module circuit 410 may include at least one connector, for example, a connector 412. A circuit of the connector 412 may be in an open state. Because a circuit of each of the at least one connector is open, a current may not flow in the module circuit 410 even though a voltage $V_{S1}$ is applied to the module circuit 410. When the module circuit 410 is shorted (for example, closed), a current may flow in the module circuit 410 and a voltage may be generated in the module circuit 410. For example, when a connection component of a hardware module is connected to the connector 412, the circuit of the connector 412 may be shorted. Also, when circuits of all connectors in the module circuit 410 are shorted, the module circuit 410 may be shorted.

A comparison circuit 420 may correspond to the comparison circuit 320. The comparison circuit 420 may compare a voltage of the module circuit 410 to a set (or, alternatively, a preset) voltage. A comparator 422 of the comparison circuit 420 may output an enable signal when a voltage $V_+$ of the module circuit 410 is greater than or equal to a set (or, alternatively, a preset) voltage $V_-$. The enable signal may be, for example, a mounting signal. The mounting signal may be a signal indicating that all hardware modules are mounted in the module circuit 410.

For example, the voltage $V_+$ of the module circuit 410 may be calculated using Equation 1 shown below, and the voltage $V_-$ may be calculated using Equation 2 shown below. In Equation 1, $V_{S1}$ denotes a voltage supplied to the module circuit 410, $R_t$ denotes a resultant resistance value of the module circuit 410, and $R_2$ denotes a resistance value for dividing the voltage $V_{S1}$. In Equation 2, $R_1$ and $R_2$ denote resistance values for dividing the voltage $V_{S1}$.

$$\text{Voltage } V_+ \text{ of module circuit} = \frac{R_t}{R_t + R_2} V_{S1} \quad \text{[Equation 1]}$$

$$\text{Voltage } V_- = \frac{R_1}{R_1 + R_2} V_{S1} \quad \text{[Equation 2]}$$

When the voltage $V_+$ is greater than or equal to the voltage $V_-$, the comparator 422 may output an enable signal as a mounting signal. For example, when the resultant resistance value $R_t$ is greater than or equal to the resistance value $R_1$, an enable signal may be output. When the voltage $V_+$ is less than the voltage $V_-$, the comparator 422 may output a disable signal. The enable signal may be output when hardware modules are mounted in the module circuit 410. In an example in which the module circuit 410 includes three connectors, when three hardware modules are mounted in the three connectors, respectively, the module circuit 410 may be closed and the voltage $V_+$ of the module circuit 410 may be generated by a current flowing in the module circuit 410. The comparator 422 may compare the voltage $V_+$ of the module circuit 410 to the voltage $V_-$, and may output an enable signal in response to the voltage $V_+$ being greater than or equal to the voltage $V_-$.

A user may input a power-on signal using a power switch 445 to supply a power to the walking assistance apparatus 100. A trigger circuit 440 may detect a trigger signal based on the input power-on signal. The trigger circuit 440 may correspond to the trigger circuit 340.

An operation signal generation circuit 430 may correspond to the operation signal generation circuit 330. The operation signal generation circuit 430 may generate an operation signal when the enable signal is output and when the trigger signal is detected. The operation signal generation circuit 430 may be, for example, an AND element. When either the enable signal or the trigger signal is received, the operation signal generation circuit 430 may not generate an operation signal.

A power control circuit 450 may correspond to the power control circuit 350. The power control circuit 450 may include an amplifier 452 and a relay circuit 454. The amplifier 452 may amplify an operation signal received based on a voltage $V_{S2}$ supplied to the amplifier 452. The relay circuit 454 may connect a battery 460 to a power supply circuit 470 using a switch, based on the amplified operation signal.

Figure 5:
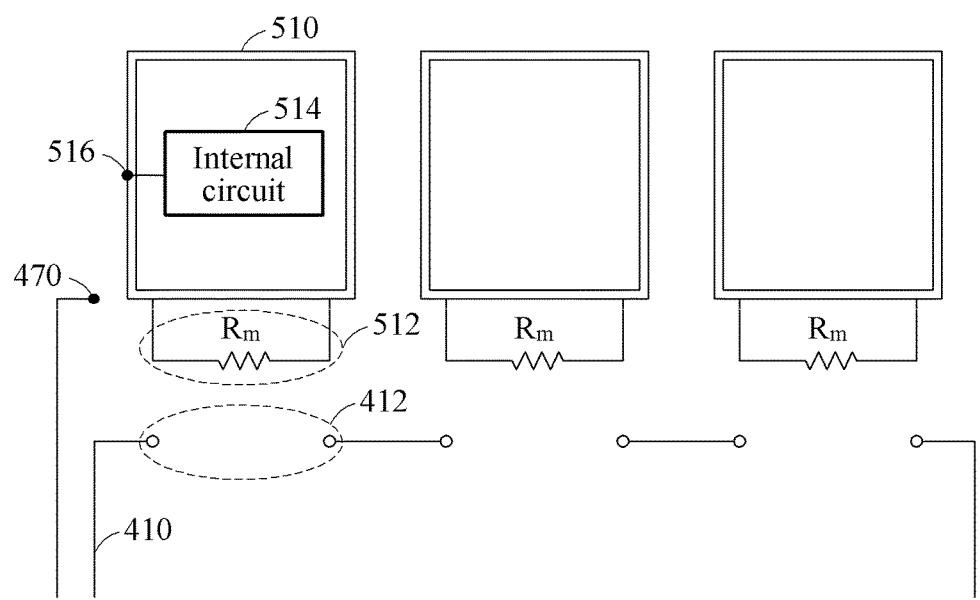
FIG. 5 illustrates an example of a module circuit and an example of a hardware module according to at least one example embodiment.

FIG. 5 illustrates an example of the module circuit 410 and a hardware module 510 according to at least one example embodiment.

Referring to FIG. 5, the hardware module 510 may include an internal circuit 514 to perform a function of the hardware module 510. For example, when the hardware module 510 is a driving portion, the internal circuit 514 may include a motor and elements configured to operate the motor. However, the hardware module 510 is not limited to the example. The internal circuit 514 may include a power reception circuit 516. When a power is supplied to the power reception circuit 516, the internal circuit 514 may operate.

The hardware module 510 may include a connection component 512 to connect the hardware module 510 to the power supply apparatus 400. For example, the connection component 512 may include a resistor $R_m$. Both ends of the connection component 512 may be isolated.

The hardware module 510 may be mounted in the connector 412 of the module circuit 410. For example, the connection component 512 of the hardware module 510 may be connected to the connector 412. When the connection component 512 and the connector 412 are connected, a circuit of the connector 412 may be shorted. A shape of the connector 412 may correspond to a shape of the hardware module 510 corresponding to the connector 412. A plurality of connectors may have different shapes.

For example, the module circuit 410 may include at least one connector corresponding to at least one hardware module. In this example, when all circuits of the at least one connector are shorted, the module circuit 410 may be shorted.

When at least one hardware module is mounted normally in at least one connector, the battery 460 may be connected to the power supply circuit 470 so that a power may be supplied to the power reception circuit 516 connected to the power supply circuit 470.

Figure 6:
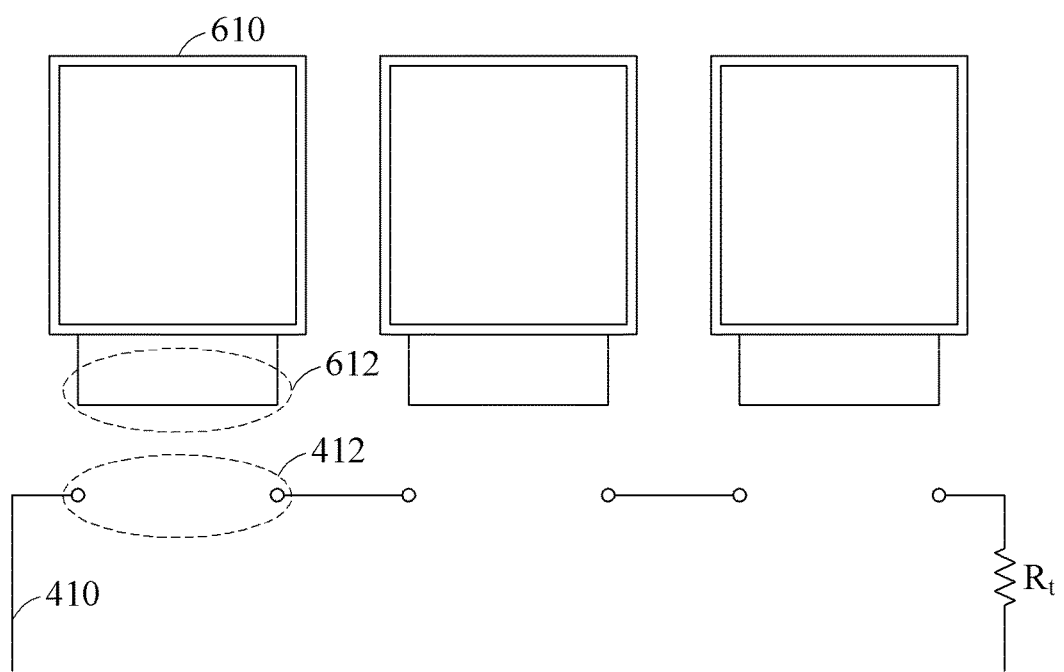
FIG. 6 illustrates another example of a module circuit and another example of a hardware module according to at least one example embodiment.

FIG. 6 illustrates another example of the module circuit 410 and a hardware module 610 according to at least one example embodiment.

Referring to FIG. 6, in the example embodiment illustrated in FIG. 6, the module circuit 410 includes a resistor $R_t$ and a connection component 612 of a hardware module 610 does not include a resistor. For example, the connection component 612 may be a metal wire, and both ends of the metal wire may be isolated. In contrast, in the example embodiment illustrated in FIG. 5, the module circuit 410 does not include a resistor and the connection component 512 includes the resistor $R_m$.

To perform the same operation in the examples of FIGS. 5 and 6, a resultant resistance value of resistors included respectively in hardware modules of FIG. 5 may need to be equal to a value of the resistor $R_t$ of FIG. 6.

Figure 7:
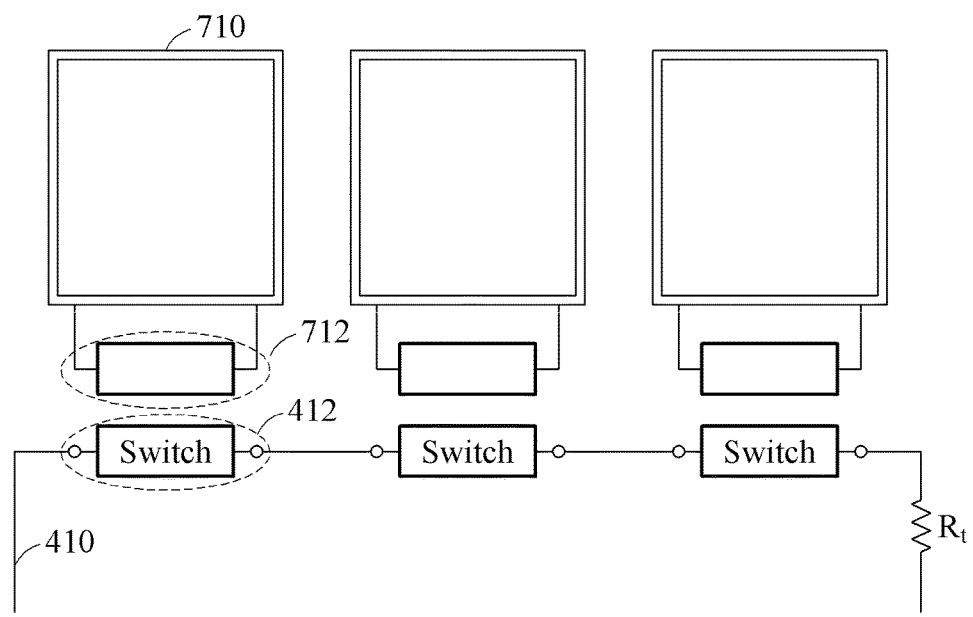
FIG. 7 illustrates a hardware module and a module circuit using a switch according to at least one example embodiment.

FIG. 7 illustrates a hardware module 710 and the module circuit 410 using a switch according to at least one example embodiment.

Figure 8:
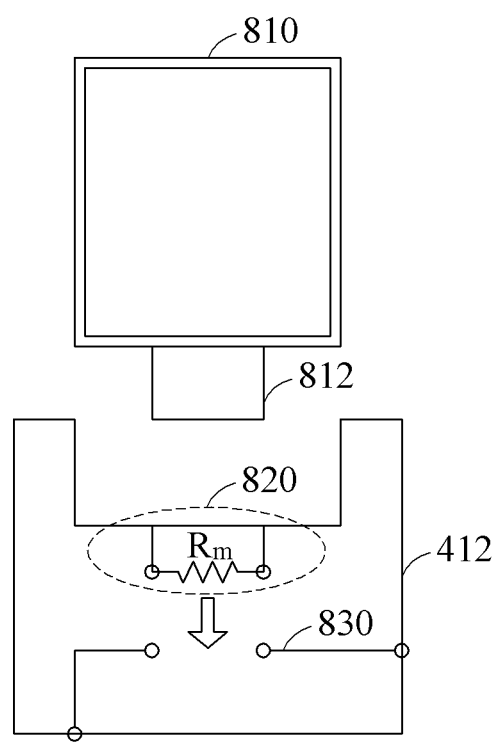
FIG. 8 illustrates a circuit of a connector including a switch according to at least one example embodiment.
Figure 9:
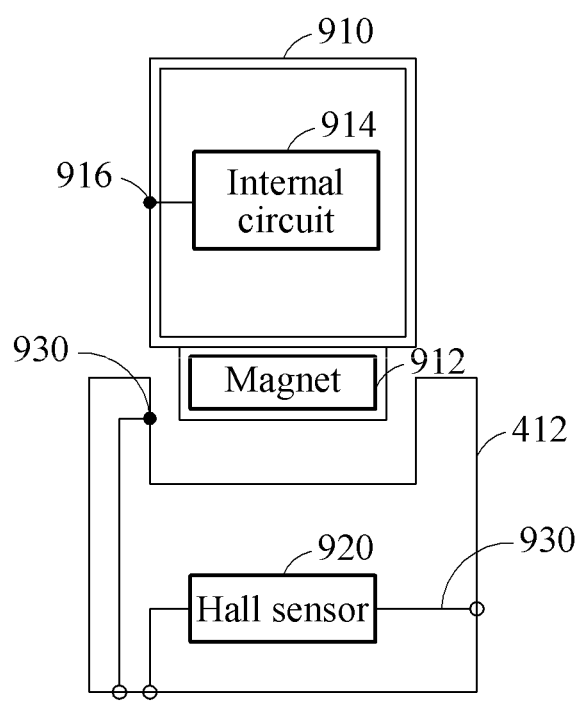
FIG. 9 illustrates a circuit of a connector including a hall sensor according to at least one example embodiment.

In FIGS. 5 and 6, the hardware modules 510 and 610 include the connection components 512 and 612 to electrically connect the hardware modules 510 and 610 to the connector 412 of the module circuit 410. In FIGS. 7, 8 and 9, a connection component of a hardware module may not be electrically connected to the module circuit 410.

Referring to FIG. 7, the connector 412 of the module circuit 410 may include a switch. The switch may be, for example, a push switch. The push switch may short the circuit of the connector 412 when a force to press the push switch is greater than or equal to a threshold. When a connection component 712 of the hardware module 710 mechanically presses the switch, the switch may short the circuit of the connector 412. When the hardware module 710 is mechanically mounted in the connector 412, the switch may be pressed by the connection component 712.

To prevent the switch from being pressed unintentionally, a shape of the connection component 712 may be uniquely designed. For example, the connection component 712 and the connector 412 may be designed to have unique shapes to press the switch when the connection component 712 is mechanically mounted in the connector 412.

FIG. 8 illustrates an example of a circuit of a connector including a switch according to at least one example embodiment.

Referring to FIG. 8, the connector 412 of the module circuit 410 may include a switch 820. When a connection component 812 of a hardware module 810 presses the switch 820, the switch 820 may be connected to a circuit 830 of the connector 412. When the hardware module 810 is mounted normally in the connector 412, the switch 820 may short the circuit 830. For example, the switch 820 may include a resistor $R_m$. Similarly to the connection component 712 of FIG. 7, a shape of the connection component 812 may be uniquely designed.

FIG. 9 illustrates an example of a circuit of a connector including a hall sensor according to at least one example embodiment.

Referring to FIG. 9, the connector 412 of the module circuit 410 may include a hall sensor 920. For example, a circuit 930 of the connector 412 may include the hall sensor 920. A connection component 912 of a hardware module 910 may include a magnet. When the magnet of the connection component 912 approaches the connector 412, a measurement value of the hall sensor 920 may increase. For example, when the measurement value of the hall sensor 920 is greater than or equal to a set (or, alternatively, a preset) threshold, the hardware module 910 may be determined to be mounted normally in the connector 412. In this example, the hall sensor 920 may short the circuit 930.

Figure 10:
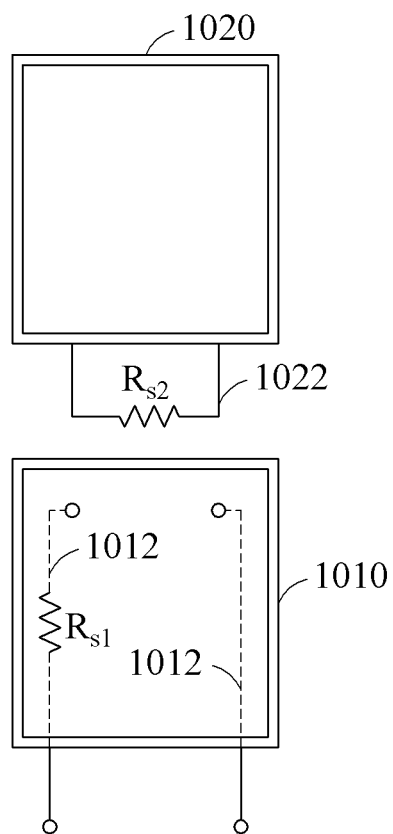
FIG. 10 illustrates a method of connecting a first hardware module and a second hardware module according to at least one example embodiment.

FIG. 10 illustrates a method of connecting a first hardware module and a second hardware module according to at least one example embodiment.

Referring to FIG. 10, hardware modules may be connected to each other. In FIG. 10, a first hardware module 1010 and a second hardware module 1020 may be connected to each other. The first hardware module 1010 may be directly mounted in the connector 412 of the module circuit 410, and the second hardware module 1020 may be connected to the module circuit 410 indirectly via the first hardware module 1010.

In an example, when the second hardware module 1020 is connected to the first hardware module 1010, a connection component 1012 of the first hardware module 1010 may be shorted. For example, the connection component 1012 may be shorted by a connection component 1022 of the second hardware module 1020. When the second hardware module 1020 is connected to the first hardware module 1010, the first hardware module 1010 may be determined to be mounted in a connector. When the second hardware module 1020 is not connected to the first hardware module 1010, a circuit of a connector may not be shorted even though the first hardware module 1010 is mounted in the connector because a circuit of the connection component 1012 is open.

A resistance value of the connection component 1012 shorted by the connection component 1022 may be calculated using Equation 3 shown below.

$$R_m = R_{s1} + R_{s2} \quad \text{[Equation 3]}$$

In Equation 3, $R_{s1}$ denotes a resistance value of a resistor included in the connection component 1012, $R_{s2}$ denotes a resistance value of a resistor included in the connection component 1022, and $R_m$ denotes the resistance value of the shorted connection component 1012. The resistance value $R_m$ may be equal to a resistance value of a connection component of a single hardware module.

In another example embodiment, the first hardware module 1010 may operate as hardware modules described above with reference to FIGS. 3 through 9 even though the second hardware module 1020 is not connected to the first hardware module 1010. When the first hardware module 1010 is mounted in a connector of the module circuit 410, the first hardware module 1010 may be recognized to be mounted in the connector regardless of whether the first hardware module 1010 is connected to the second hardware module 1020. The connection component 1012 may be located in parallel to a connector and a resistor for a connection to the connection component 1022.

Figure 11:
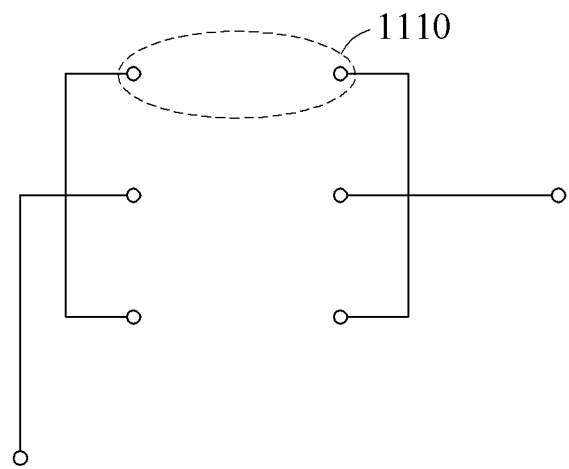
FIG. 11 illustrates a module circuit including connectors arranged in parallel according to at least one example embodiment.

FIG. 11 illustrates an example of a module circuit including connectors arranged in parallel according to at least one example embodiment.

Referring to FIG. 11, the module circuit 410 may include connectors connected in parallel. In contrast, in other example embodiments, as illustrated in FIGS. 4 through 7, connectors of the module circuit 410 may be connected in series.

When at least one circuit of the connectors connected to each other in parallel is shorted, the module circuit 410 may be shorted. For example, when a hardware module corresponding to a connector 1110 is mounted in the connector 1110, the module circuit 410 may be shorted. When a connection component of a hardware module includes a resistor, a resultant resistance value of the module circuit 410 may decrease based on an increase in a number of hardware modules mounted in a connector. Due to a reduction in the resultant resistance value, a voltage of the module circuit 410 may decrease.

A minimum number of hardware modules that need to be mounted in the module circuit 410 may be set in advance. For example, when a voltage of the module circuit 410 is less than or equal to a set (or, alternatively, a preset) voltage, a number of hardware modules mounted in the module circuit 410 may be determined to be greater than or equal to the set minimum number.

The comparison circuit 420 may include a plurality of comparators. Each of the plurality of comparators may compare the voltage of the module circuit 410 to a voltage set for each of the comparators. For example, a first comparator may detect that the voltage of the module circuit 410 is greater than or equal to a first voltage. A second comparator may detect that the voltage of the module circuit 410 is less than a second voltage. When the voltage of the module circuit 410 is greater than or equal to the first voltage and is less than the second voltage, a minimum number of hardware modules may be determined to be connected to the module circuit 410. To adjust the first voltage, the second voltage and the voltage of the module circuit 410, a resistance value of a resistor included in a circuit may be adjusted.

Figure 12:
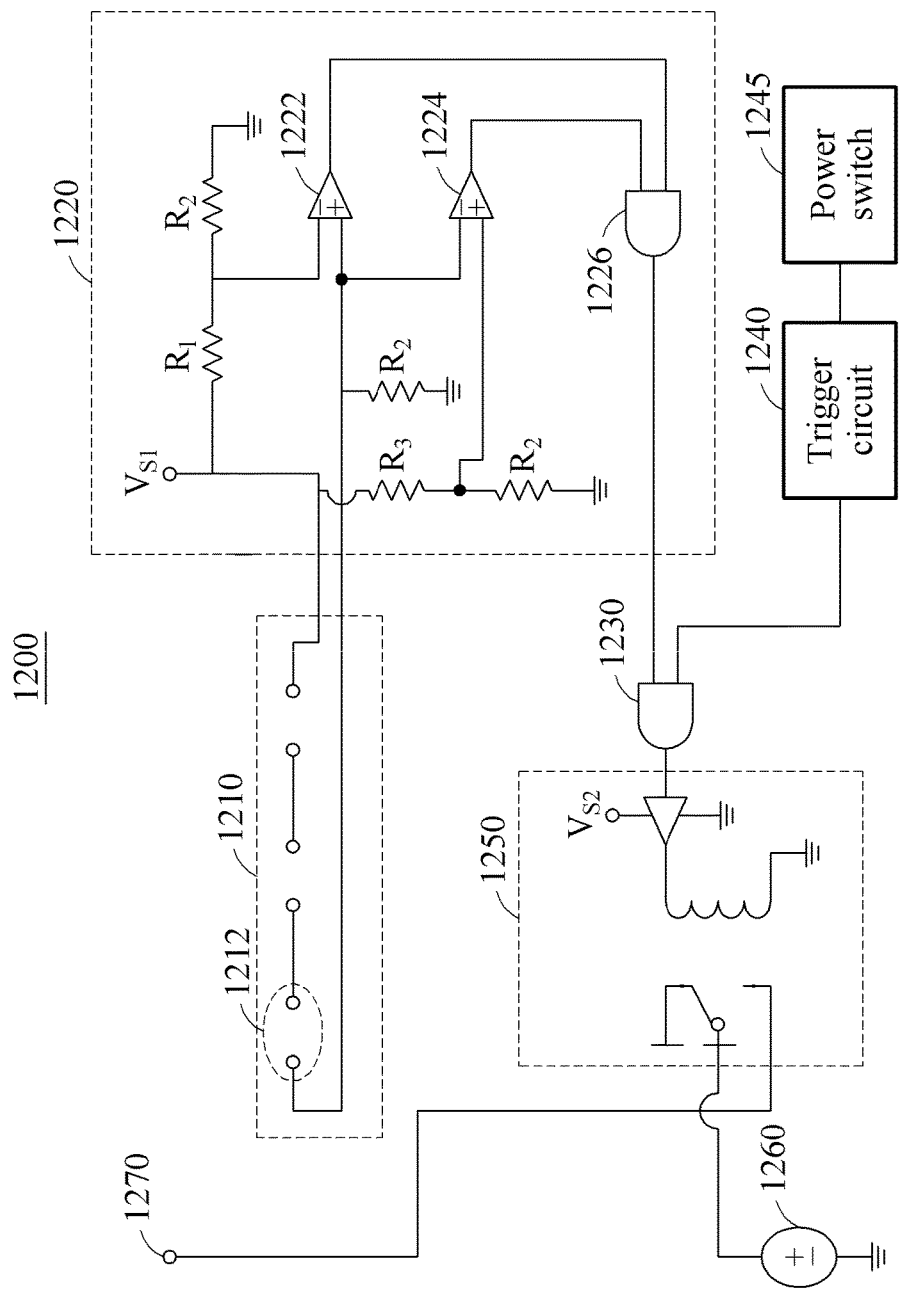
FIG. 12 illustrates another example of a configuration of a power supply apparatus according to at least one example embodiment.

FIG. 12 illustrates a configuration of a power supply apparatus 1200 according to at least one example embodiment.

Referring to FIG. 4, when the connector 412 of the module circuit 410 is abnormally connected to a hardware module, the voltage of the module circuit 410 may abnormally increase. Even though the voltage abnormally increases, the comparator 422 may output an enable signal. When a voltage is supplied to a hardware module even though the hardware module is abnormally mounted in the connector 412 of the module circuit 410, the hardware module or the walking assistance apparatus 100 of FIG. 1 may operate abnormally. To prevent the above situation, a plurality of comparators may be used.

Referring to FIG. 12, the power supply apparatus 1200 may include a module circuit 1210, a comparison circuit 1220, an operation signal generation circuit 1230, a trigger circuit 1240, a power control circuit 1250 and a power supply circuit 1270. The above description of the module circuit 410, the operation signal generation circuit 430, the trigger circuit 440, the power control circuit 450 and the power supply circuit 470 of FIG. 4 is also applicable to the module circuit 1210, the operation signal generation circuit 1230, the trigger circuit 1240, the power control circuit 1250 and the power supply circuit 1270, and accordingly is not repeated here.

The comparison circuit 1220 may include a first comparator 1222, a second comparator 1224 and an AND element 1226. The first comparator 1222 may compare a voltage of the module circuit 1210 to a first voltage that is set in advance. When the voltage of the module circuit 1210 is greater than or equal to the first voltage, the first comparator 1222 may output a first signal. The first signal may be a first mounting signal. The above description of the comparator 422 of FIG. 4 is also applicable to the first comparator 1222, and accordingly is not repeated here. Referring to Equation 1 described above, when the resultant resistance value $R_t$ is greater than or equal to the resistance value $R_1$, the first mounting signal may be output.

When the voltage of the module circuit 1210 is less than a second voltage that is set in advance, the second comparator 1224 may output a second signal. The second signal may be a second mounting signal. For example, the voltage of the module circuit 1210, and the second voltage may be calculated using Equations 4 and 5 shown below, respectively. In Equation 4, $V_{S1}$ denotes a voltage supplied to the module circuit 1210, $R_t$ denotes a resultant resistance value of the module circuit 1210, and $R_2$ denotes a resistance value for dividing the voltage $V_{S1}$. In Equation 5, $R_2$ and $R_3$ denote resistance values for dividing the voltage $V_{S1}$. When the resultant resistance value $R_t$ is less than the resistance value $R_3$ in Equations 4 and 5, the second mounting signal may be output.

$$\text{Voltage of module circuit} = \frac{R_t}{R_t + R_2} V_{s1} \qquad \text{[Equation 4]}$$

$$\text{Second voltage} = \frac{R_3}{R_2 + R_3} V_{s1} \qquad \text{[Equation 5]}$$

The AND element 1226 may output a mounting signal based on the first mounting signal and the second mounting signal. For example, when the first mounting signal and the second mounting signal are simultaneously received, the AND element 1226 may output a mounting signal. When the resultant resistance value $R_t$ is greater than or equal to the resistance value $R_1$ and is less than the resistance value $R_3$, a mounting signal may be output.

Figure 13:
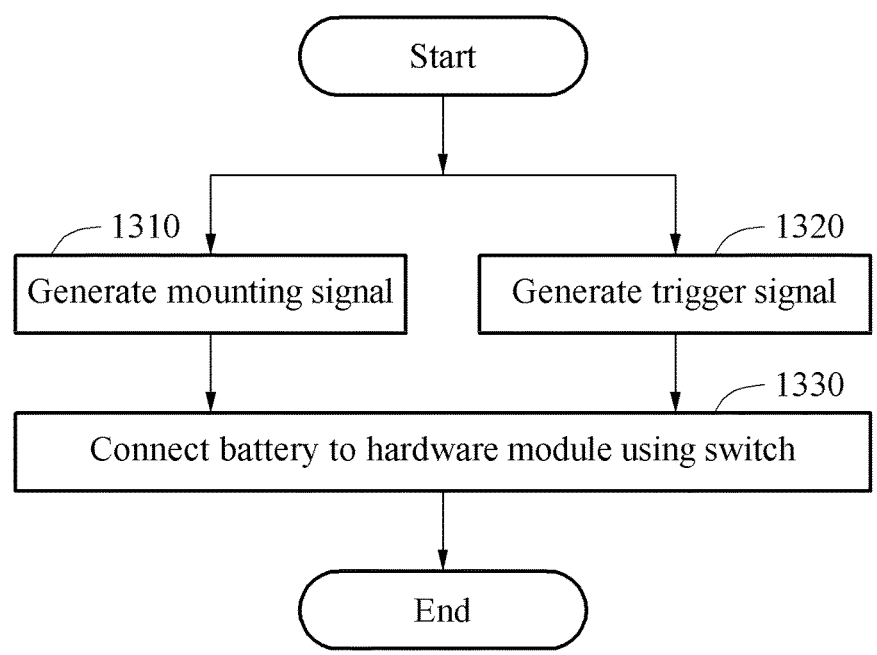
FIG. 13 is a flowchart illustrating a power supply method according to at least one example embodiment.

FIG. 13 is a flowchart illustrating a power supply method according to at least one example embodiment.

Referring to FIG. 13, in operation 1310, the power supply apparatus 400, 1200 may generate a mounting signal, if at least one hardware module is mounted in a module circuit of a power supply apparatus. For example, the at least one hardware module may respectively correspond to at least one connector. When all hardware modules are mounted in connectors, respectively, a mounting signal may be generated. A scheme of generating a mounting signal will be further described with reference to FIGS. 14, 15 and 16.

In operation 1320, the power supply apparatus 400, 1200 may generate a trigger signal. For example, in response to a power-on signal input by a user, a trigger signal may be generated. A trigger circuit may detect a trigger signal from a power-on signal.

In operation 1330, the power supply apparatus 400, 1200 may connect a battery to each of the at least one hardware module using a switch of a circuit, when both the mounting signal and the trigger signal are detected. For example, a relay circuit may connect a battery to a power reception circuit of a hardware module using a switch. In an example, when both a mounting signal and a trigger signal are detected, a switch of a relay circuit may be closed. In another example, when a mounting signal is not detected even though a trigger signal is detected, the switch of the relay circuit may be open. A scheme of opening or closing the switch of the power supply circuit will be further described with reference to FIG. 17.

Figure 14:
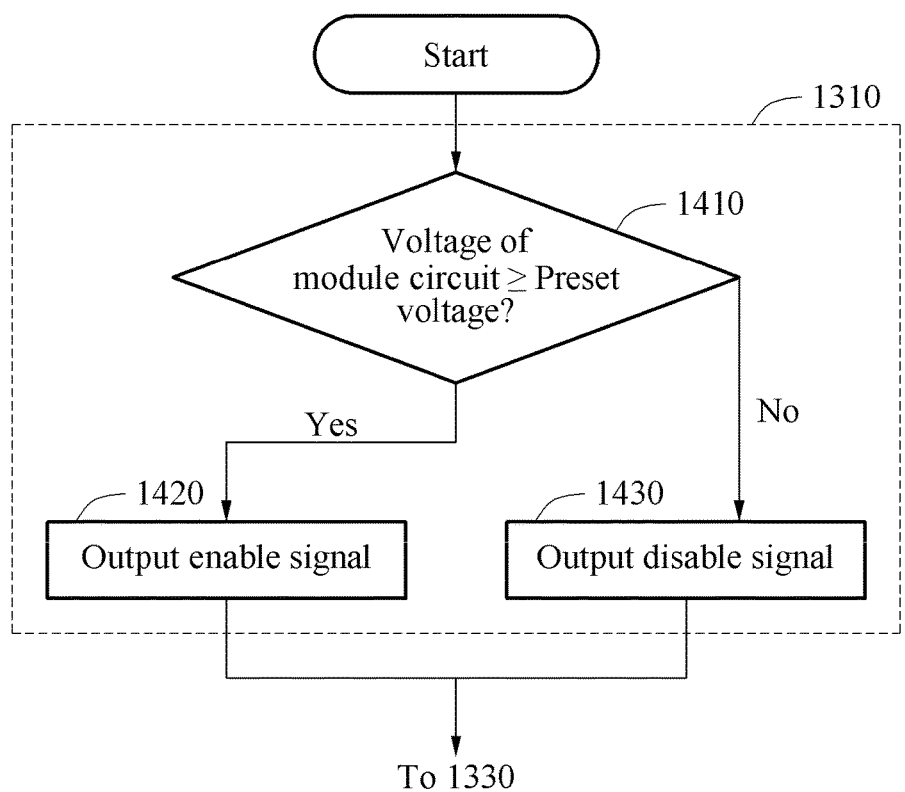
FIG. 14 is a flowchart illustrating an example of an operation of outputting a mounting signal in the method of FIG. 13.

FIG. 14 is a flowchart illustrating an example of an operation of outputting a mounting signal in the method of FIG. 13.

Referring to FIGS. 1 and 14, operation 1310 of FIG. 13 may include operations 1410, 1420 and 1430 of FIG. 14.

In operation 1410, a comparator may compare a voltage of the module circuit to a set (or, alternatively, a preset) voltage. The comparator may be, for example, the comparator 422 of FIG. 4.

In operation 1420, the comparator may output an enable signal as a mounting signal when the voltage of the module circuit is greater than or equal to the set voltage. The mounting signal may be a signal indicating that at least one hardware module is mounted in at least one corresponding connector of the module circuit.

In operation 1430, the comparator may output a disable signal when the voltage of the module circuit is less than the set voltage.

Figure 15:
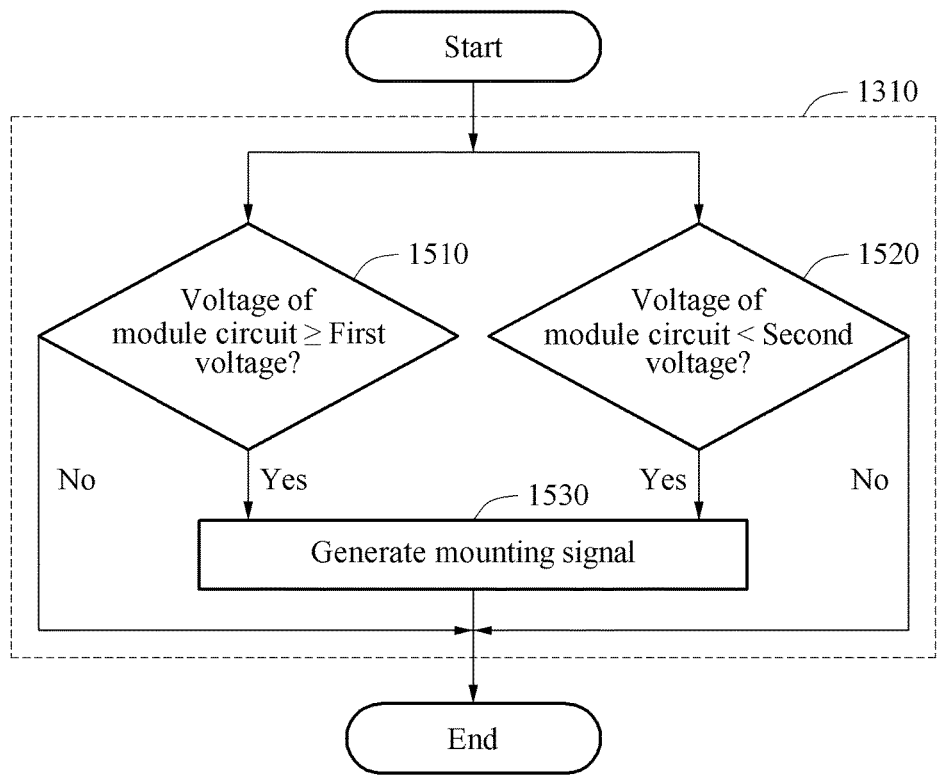
FIG. 15 is a flowchart illustrating another example of an operation of outputting a mounting signal in the method of FIG. 13.

FIG. 15 is a flowchart illustrating another example of an operation of outputting a mounting signal in the method of FIG. 13.

Referring to FIGS. 13 and 15, operation 1310 of FIG. 13 may include operations 1510, 1520 and 1530 of FIG. 15.

In operation 1510, a first comparator may compare a voltage of the module circuit to a first voltage that is set in advance. The first comparator may output a first mounting signal when the voltage of the module circuit is greater than or equal to the first voltage. The first comparator may be, for example, the first comparator 1222 of FIG. 12.

In operation 1520, a second comparator may compare the voltage of the module circuit to a second voltage that is set in advance. The second comparator may output a second mounting signal when the voltage of the module circuit is less than the second voltage. The second comparator may be, for example, the second comparator 1224 of FIG. 12.

In operation 1530, an AND element may output a mounting signal based on the first mounting signal and the second mounting signal. For example, when the first mounting signal and the second mounting signal are simultaneously received, the AND element may output a mounting signal. The AND element may be, for example, the AND element 1226 of FIG. 12.

Figure 16:
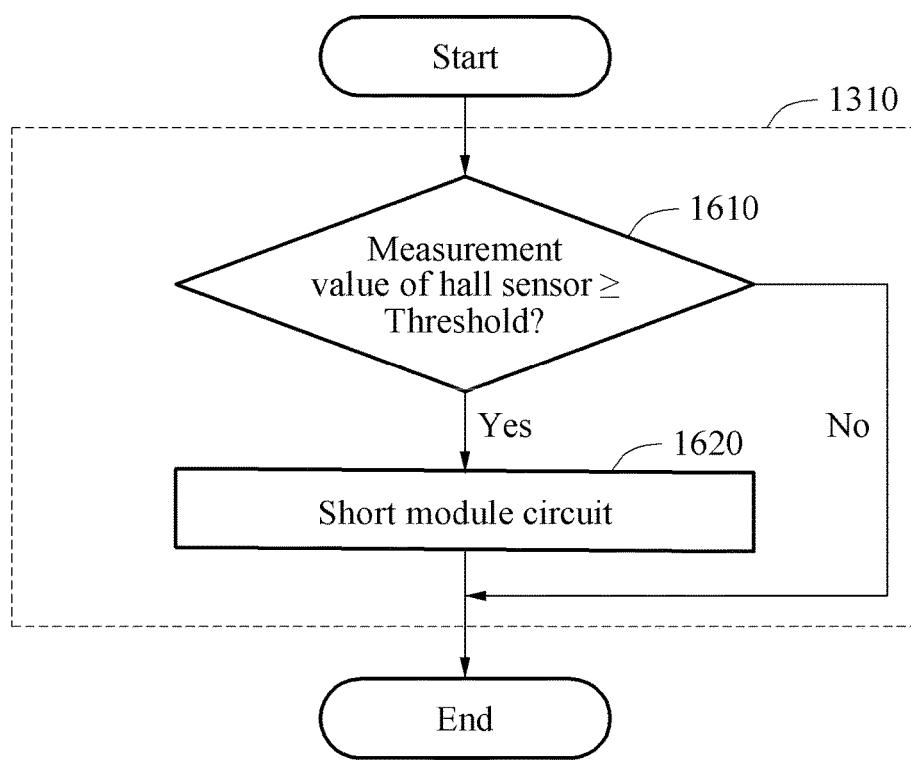
FIG. 16 is a flowchart illustrating an operation of outputting a mounting signal using a hall sensor in the method of FIG. 13.

FIG. 16 is a flowchart illustrating an operation of outputting a mounting signal using a hall sensor in the method of FIG. 13.

Referring to FIGS. 13 and 16, operation 1310 of FIG. 13 may include operations 1610 and 1620 of FIG. 16.

In operation 1610, the hall sensor determines whether a measurement value of the hall sensor is greater than or equal to a set (or, alternatively, a preset) threshold when a hardware module corresponding to the hall sensor is mounted in the module circuit. The measurement value of the hall sensor may be generated by a magnet included in the hardware module. The hall sensor may be, for example, the hall sensor 920 of FIG. 9 and the magnet may be, for example the magnet 912 of FIG. 9.

In operation 1620, the hall sensor may short the module circuit when the measurement value is greater than or equal to the threshold.

Figure 17:
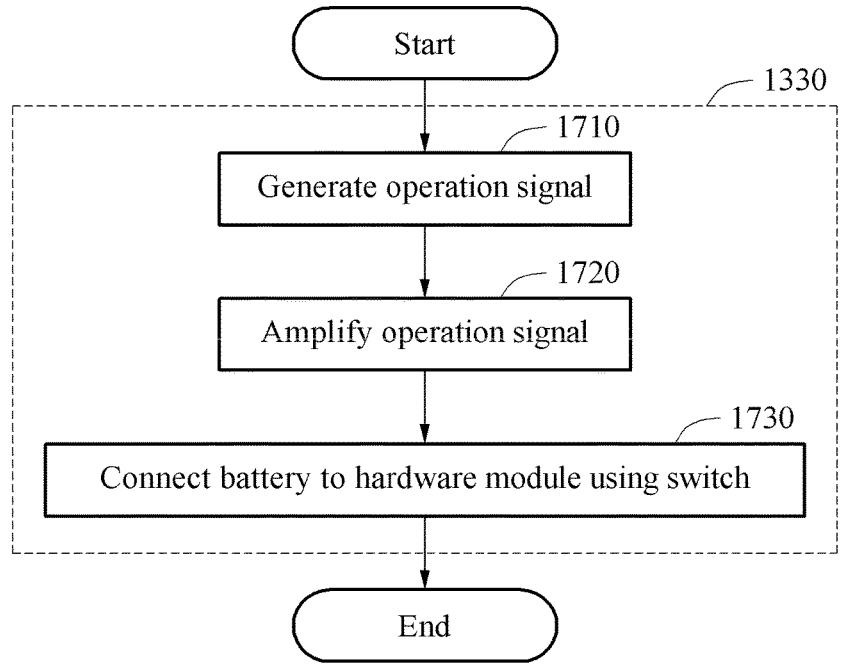
FIG. 17 is a flowchart illustrating an operation of connecting a battery to a hardware module in the method of FIG. 13.

FIG. 17 is a flowchart illustrating an example of connecting a battery to a hardware module in operation 1330 of FIG. 13.

Referring to FIGS. 13 and 17, operation 1330 may include operations 1710, 1720 and 1730 of FIG. 17.

In operation 1710, an operation signal generation circuit may generate an operating signal based on a mounting signal and a trigger signal. For example, the operation signal generation circuit may be an AND element, and the operation signal may be generated when both the mounting signal and the trigger signal are received. The operation signal generation circuit may be, for example, the operation signal generation circuit 430 of FIG. 4.

In operation 1720, an amplifier may amplify the operation signal. The amplifier may be, for example, the amplifier 452 of FIG. 4.

In operation 1730, a relay circuit may connect the battery to each of the at least one hardware module using a switch, based on the amplified operation signal. The relay circuit may be, for example, the relay circuit 454 of FIG. 4.

The units and/or modules described herein may be implemented using hardware components, software components, or a combination thereof. For example, the hardware components may include microphones, amplifiers, band-pass filters, audio to digital converters, and processing devices. A processing device may be implemented using one or more hardware device configured to carry out and/or execute program code by performing arithmetical, logical, and input/output operations. The processing device(s) may include a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

The software may include a computer program, a piece of code, an instruction, or some combination thereof, to independently or collectively instruct and/or configure the processing device to operate as desired, thereby transforming the processing device into a special purpose processor. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more non-transitory computer readable recording mediums.

The methods according to the above-described example embodiments may be recorded in non-transitory computer-readable media including program instructions to implement various operations of the above-described example embodiments. The media may also include, alone or in combination with the program instructions, data files, data structures, and the like. The program instructions recorded on the media may be those specially designed and constructed for the purposes of example embodiments, or they may be of the kind well-known and available to those having skill in the computer software arts. Examples of non-transitory computer-readable media include magnetic media such as hard disks, floppy disks, and magnetic tape; optical media such as CD-ROM discs, DVDs, and/or Blue-ray discs; magneto-optical media such as optical discs; and hardware devices that are specially configured to store and perform program instructions, such as read-only memory (ROM), random access memory (RAM), flash memory (e.g., USB flash drives, memory cards, memory sticks, etc.), and the like. Examples of program instructions include both machine code, such as produced by a compiler, and files containing higher level code that may be executed by the computer using an interpreter. The above-described devices may be configured to act as one or more software modules in order to perform the operations of the above-described example embodiments, or vice versa.

A number of example embodiments have been described above. Nevertheless, it should be understood that various modifications may be made to these example embodiments. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method of supplying a power to at least one hardware device, the method comprising:
   generating a mounting signal, if the at least one hardware device is mounted in a module circuit;
   generating a trigger signal in response to a power-on signal input by a user; and
   connecting a battery to each of the at least one hardware device, if both the mounting signal and the trigger signal are detected.

2. The method of claim 1, wherein the generating the mounting signal comprises:
   outputting an enable signal as the mounting signal, if the voltage of the module circuit is greater than or equal to a set voltage; and
   outputting a disable signal, if the voltage of the module circuit is less than the set voltage.

3. The method of claim 1, wherein the generating the mounting signal comprises:
   generating the mounting signal, if the voltage of the module circuit is greater than or equal to a first set voltage and the voltage of the module circuit is less than a second set voltage.

4. The method of claim 1, wherein the module circuit comprises:
   one or more switches each corresponding to one of the at least one hardware device, the one or more switches each being configured to short the module circuit, if a corresponding one of the at least one hardware device is mounted in the module circuit.

5. The method of claim 1, wherein the module circuit comprises:
   one or more hall sensors each corresponding to one of the at least one hardware device, the one or more the hall sensors being configured to short the module circuit, if a corresponding one of the at least one hardware device is mounted in the module circuit.

6. The method of claim 5, wherein the generating the mounting signal comprises:

determining whether a measurement value of the one or more hall sensors is greater than or equal to a set threshold, the measurement value being generated by a magnet included in the at least one hardware device; and shorting, by the one or more hall sensors, the module circuit when the measurement value is greater than or equal to the threshold.

7. The method of claim 1, wherein the connecting the battery to each of the at least one hardware device comprises:

generating an operation signal when both the mounting signal and the trigger signal are detected;

amplifying the operation signal; and connecting, via a relay circuit, the battery to each of the at least one hardware device based on the amplified operation signal.

8. An apparatus configured to supply a power to at least one hardware device, the apparatus comprising:

a module circuit including at least one connector each corresponding to a respective one of the at least one hardware device;

a comparison circuit configured to output a mounting signal, if a voltage of the module circuit is greater than or equal to a set voltage;

a trigger circuit configured to detect a trigger signal in response to a power-on signal input by a user;

an operation signal generation circuit configured to generate an operation signal based on the mounting signal and the trigger signal; and a power control circuit configured to connect a battery to each of the at least one hardware device based on the operation signal.

9. The apparatus of claim 8, wherein the apparatus is configured to short a circuit of each of the at least one connector, if the at least one hardware device is mounted in the at least one connector.

10. The apparatus of claim 8, wherein the comparison circuit is further configured to, compare the voltage of the module circuit to the set voltage;

output an enable signal as the mounting signal, if the voltage of the module circuit is greater than or equal to the set voltage; and output a disable signal, if the voltage of the module circuit is less than the set voltage.

11. The apparatus of claim 8, wherein the comparison circuit comprises:

a first comparator configured to output a first mounting signal, if the voltage of the module circuit is greater than or equal to a first set voltage;

a second comparator configured to output a second mounting signal, if the voltage of the module circuit is less than a second set voltage; and an AND element configured to output the mounting signal based on the first mounting signal and the second mounting signal.

12. The apparatus of claim 8, wherein each of the at least one connector comprises:

a switch configured to short a circuit of a connector, if one of the at least one hardware device corresponding to the switch is mounted in the connector.

13. The apparatus of claim 8, wherein each of the at least one connector comprises:

a hall sensor configured to short a circuit of a connector, if the at least one hardware device corresponding to the hall sensor is mounted in the connector.

14. The apparatus of claim 13, wherein the hall sensor is further configured to, determine whether a measurement value of the hall sensor generated by a magnet included in the at least one hardware device corresponding to the hall sensor is greater than or equal to a set threshold, and short the circuit of the connector, if the measurement value is greater than or equal to the set threshold.

15. The apparatus of claim 8, wherein the power control circuit comprises:

an amplifier configured to amplify the operation signal; and a relay circuit configured to connect the battery to each of the at least one hardware device based on the amplified operation signal.

16. The apparatus of claim 8, wherein the apparatus is included in a walking assistance apparatus, the walking assistance apparatus including the at least one hardware device.

* * * * *